United States Patent
Rösel

(10) Patent No.: US 9,448,260 B2
(45) Date of Patent: Sep. 20, 2016

(54) ASCERTAINING THE BALLISTIC TRAJECTORY OF AN ELECTROMAGNETICALLY DRIVEN ARMATURE OF A COIL ACTUATOR

(75) Inventor: Gerd Rösel, Regensburg (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 723 days.

(21) Appl. No.: 13/877,033

(22) PCT Filed: Sep. 28, 2011

(86) PCT No.: PCT/EP2011/066939
§ 371 (c)(1),
(2), (4) Date: Mar. 29, 2013

(87) PCT Pub. No.: WO2012/041936
PCT Pub. Date: Apr. 5, 2012

(65) Prior Publication Data
US 2013/0197837 A1    Aug. 1, 2013

(30) Foreign Application Priority Data

Oct. 1, 2010  (DE) .................. 10 2010 041 880

(51) Int. Cl.
| | | |
|---|---|---|
| *G01R 19/00* | (2006.01) | |
| *F02D 41/20* | (2006.01) | |
| *F02M 45/04* | (2006.01) | |

(52) U.S. Cl.
CPC ........... *G01R 19/0084* (2013.01); *F02D 41/20* (2013.01); *F02M 45/04* (2013.01); *F02D 2041/2051* (2013.01); *F02D 2041/2055* (2013.01); *F02D 2200/063* (2013.01)

(58) Field of Classification Search
CPC .................. F92D 41/20; F02M 45/04; F02D 2041/2051; F02D 2200/063; G01R 19/0084
USPC ............................................. 702/64; 361/160
See application file for complete search history.

(56) References Cited

U.S. PATENT DOCUMENTS

| | | | |
|---|---|---|---|
| 5,245,501 A |  | 9/1993 | Locher et al. ................ 361/154 |
| 6,269,784 B1 | * | 8/2001 | Newton .................... F01L 9/04 |
| | | | 123/90.11 |

(Continued)

FOREIGN PATENT DOCUMENTS

| | | | | |
|---|---|---|---|---|
| DE | 3843138 A1 | 6/1990 | ............... | B60T 8/36 |
| DE | 19832196 A1 | 1/2000 | ............... | H01F 7/18 |

(Continued)

OTHER PUBLICATIONS

German Office Action, Application No. 10 2010 041 880.3, 5 pages, Jul. 26, 2011.
International Search Report and Written Opinion, Application No. PCT/EP2011/066939, 14 pages, Feb. 14, 2012.

*Primary Examiner* — Carol S Tsai
(74) *Attorney, Agent, or Firm* — Slayden Grubert Beard PLLC

(57) ABSTRACT

A method for determining the movement time curve of an electromagnetically driven armature of an actuator that has a coil may include: (a) applying to the coil a control signal dimensioned such that the armature undergoes only a partial deviation from the armature starting position without reaching an end position defined by a stop, and reaches the armature starting position again after reaching a turnaround position, wherein the deviation of the armature over time is described at least approximately by a section of a parabola at least between the turnaround position and the starting position, (b) determining the time at which the armature reaches the armature starting position again, (c) determining the speed with which the armature reaches the armature starting position again, and (d) ascertaining the movement time curve of the armature using a mathematical equation that describes the parabola based on the detected time and the detected speed.

13 Claims, 2 Drawing Sheets

(56) References Cited

U.S. PATENT DOCUMENTS

| | | | | |
|---|---|---|---|---|
| 6,292,345 B1* | 9/2001 | Muller | ................ | F02D 41/20 361/160 |
| 7,143,743 B2* | 12/2006 | Uda | ................ | F02D 9/1095 123/399 |
| 7,404,454 B2* | 7/2008 | Hulick | ................ | E21B 4/20 175/26 |
| 2001/0043450 A1* | 11/2001 | Seale | ................ | F01L 9/04 361/160 |
| 2006/0016427 A1* | 1/2006 | Uda | ................ | F02D 9/1095 123/399 |
| 2006/0201488 A1 | 9/2006 | Kohler et al. | ................ | 123/479 |
| 2007/0256861 A1* | 11/2007 | Hulick | ................ | E21B 4/20 175/26 |
| 2014/0092516 A1* | 4/2014 | Koch | ................ | F02D 41/20 361/160 |

FOREIGN PATENT DOCUMENTS

| | | | |
|---|---|---|---|
| DE | 19834405 A1 | 2/2000 | ............. F02D 41/20 |
| DE | 10347056 A1 | 5/2005 | ............. F02D 41/20 |
| DE | 102006035225 A1 | 2/2007 | ............. H01F 7/122 |
| DE | 102008001397 A1 | 10/2009 | ............... H01F 7/18 |
| DE | 102009047453 A1 | 6/2011 | ............. F16K 31/06 |
| WO | 2012/041936 A1 | 4/2012 | ............. F02D 41/20 |

* cited by examiner

ASCERTAINING THE BALLISTIC TRAJECTORY OF AN ELECTROMAGNETICALLY DRIVEN ARMATURE OF A COIL ACTUATOR

CROSS-REFERENCE TO RELATED APPLICATIONS

This application is a U.S. National Stage Application of International Application No. PCT/EP2011/066939 filed Sep. 28, 2011, which designates the United States of America, and claims priority to DE Application No. 10 2010 041 880.3 filed Oct. 1, 2010, the contents of which are hereby incorporated by reference in their entirety.

TECHNICAL FIELD

The present disclosure relates to the technical field of electromagnetically driven actuators which have a coil to which a drive signal can be applied and an armature mounted movably relative to the coil. The present disclosure relates in particular to a method for ascertaining the movement-time profile of an electromagnetically driven armature of an actuator having a coil, wherein the armature experiences only a partial deflection out of its initial position without reaching an end position defined by a stop and, after reaching a reversal position, reaches its initial position again, wherein, at least between the reversal position and the initial position, the deflection of the armature is described as a function of time at least approximately by a section of a parabola. In addition, the present disclosure relates to a corresponding apparatus for determining the parabolic (ballistic) trajectory of an electromagnetically driven armature of an actuator having a coil and to a computer program for controlling the abovementioned method.

BACKGROUND

Electromagnetically driven actuators can be operated with low tolerance in the so-called full-stroke operating mode. This means that an armature of the actuator is moved to and fro between an initial position and an end position. In this case, the initial position and the end position are typically each defined by a mechanical stop of the armature on a housing of the actuator. Using the example of an injection valve for fuel injection, this operating mode means that a valve needle of the injection valve is moved in each case up to a maximum deflection. A variation of the injected fuel quantity then takes place by appropriately matching the duration of the injection process.

In order to reduce emissions of pollutants and/or the fuel consumption of motor vehicles, it is necessary, however, in modern injection systems, to manage the operation of injection valves as accurately as possible even in the case of small injection quantities. This means that the so-called ballistic operation of an injection valve is also managed. Ballistic operation of an injection valve is understood in this context to mean a partial deflection of the armature or the valve needle in a trajectory which is predetermined by electrical and/or design parameters and is free once the electromagnetic force introduction onto the armature is complete, i.e. parabolic trajectory, without reaching the full stop.

In contrast to the full-stroke operation, the ballistic operation of an injection valve is subject to markedly more tolerances since, in this case, both electrical and mechanical tolerances influence the opening profile to a considerably greater extent than is the case in the full-stroke operation.

For the ballistic operating mode of an injection valve, generally of an electromagnetically driven armature of an actuator having a coil, in this case the following tolerances can occur individually or in combination:

a) Opening tolerance: the time at which the armature moves away from its initial position once a defined electrical drive pulse has been applied to the coil is dependent on the electrical, magnetic and/or mechanical properties of the individual injection valve and/or on the operating state thereof (for example temperature).

b) Closing tolerance: the time at which the armature returns to its initial position after a partial deflection is dependent on the electrical, magnetic and/or mechanical properties of the individual injection valve and/or on the operating state thereof.

c) Stroke tolerance: in the case of a partial deflection of the armature, the maximum stroke reached is likewise dependent on the electrical, magnetic and/or mechanical properties of the individual injection valve and/or on the operating state thereof. The stroke tolerance results in an individual change in the parabolic trajectory of the armature with the possibility of leveling-off or peaking of the corresponding deflection curve.

DE 10 2006 035 225 A1 discloses an electromagnetic actuating apparatus which has a coil. By virtue of evaluation of induced voltage signals which are caused by external mechanical influences, the actual movement of the actuating apparatus can be analyzed.

DE 198 34 405 A1 discloses a method for estimating a needle stroke of a solenoid valve. During the movement of the valve needle relative to a coil of the solenoid valve, the voltages induced in the coil are detected and set in relation to the stroke of the valve needle by means of a computation model. In order to ascertain the contact time, the time derivative dU/dt of the coil voltage can be used since this signal has very sudden changes at the reversal point of the needle or armature movement.

DE 38 43 138 A1 discloses a method for controlling and detecting the movement of an armature of an electromagnetic switching element. On disconnection of the switching element, a magnetic field is induced in the field winding of said switching element, which magnetic field is changed by the armature movement. The changes over time in the voltage present at the field winding which occur on the basis of this can be used to detect the end of the armature movement.

SUMMARY

One embodiment provides a method for ascertaining the movement-time profile of an electromagnetically driven armature of an actuator having a coil, the method comprising: applying a drive signal to the coil, which drive signal is dimensioned such that the armature experiences only a partial deflection from its initial position without reaching an end position defined by a stop, and after reaching a reversal position, again reaches its initial position, wherein, at least between the reversal position and the initial position, the deflection of the armature is described as a function of time at least approximately by a section of a parabola; determining the time at which the armature reaches its initial position again; determining the speed at which the armature reaches its initial position again; and ascertaining the movement-time profile of the armature using a mathematical equation described in the parabola on the basis of the detected time and the detected speed.

In a further embodiment, the determination of the time comprises: detecting a time profile of a characteristic voltage induced in the deenergized coil, wherein the induced characteristic voltage is produced at least partially by a movement of the magnet armature relative to the coil; evaluating the detected time profile of the characteristic voltage induced in the coil, wherein the evaluation comprises a comparison of the detected time profile of the characteristic voltage induced in the deenergized coil with a characteristic reference voltage profile stored in a control unit; and ascertaining the time at which the armature reaches its initial position again, on the basis of the evaluated time profile.

In a further embodiment, the determination of the speed comprises detecting a voltage level of the detected time profile of the characteristic voltage induced in the deenergized coil directly prior to the ascertained time at which the armature reaches its initial position again.

In a further embodiment, the method further comprises determining a change in the speed of the armature directly before the armature reaches its initial position again, wherein the determination of the movement-time profile of the armature is performed using a mathematical equation describing the parabola further on the basis of the ascertained change in speed.

In a further embodiment, the determination of the change in speed comprises detecting a change in the voltage level of the detected time profile of the characteristic voltage induced in the deenergized coil directly prior to the ascertained time at which the armature reaches its initial position again.

In a further embodiment, the actuator is an injection valve in particular for an internal combustion engine.

Another embodiment provides a method for the regulated operation of an actuator, which has a coil and an electromagnetically drivable armature which is mounted movably relative to the coil, the method comprising: ascertaining the movement profile of the electromagnetically driven armature by means of a method as claimed in one of the preceding claims; applying a further drive signal to the coil; wherein the further drive signal is dependent on the ascertained movement-time profile of the armature in response to the drive signal in such a way that a further movement sequence as a result of the further drive signal at least approximately corresponds to a predetermined setpoint movement profile.

Another embodiment provides an apparatus for ascertaining the movement-time profile of an electromagnetically driven armature of an actuator having a coil, the apparatus comprising: a drive unit for applying a drive signal to the coil, which drive signal is dimensioned such that the armature experiences only a partial deflection from its initial position without reaching an end position defined by a stop, and after reaching a reversal position, reaches its initial position again, wherein, at least between the reversal position and the initial position, the deflection of the armature is described as a function of time at least approximately by a section of a parabola; a unit for determining the time at which the armature reaches its initial position again, and for determining the speed at which the armature reaches its initial position again; and an evaluation unit for ascertaining the movement-time profile of the armature using a mathematical equation describing the parabola on the basis of the detected time and the detected speed.

Another embodiment provides a computer program for ascertaining the movement-time profile of an electromagnetically driven armature of an actuator having a coil, in particular a direct injection valve for an internal combustion engine of a motor vehicle, wherein the computer program is stored in non-transitory computer-readable media and executable by a processor to perform any of the methods described above.

BRIEF DESCRIPTION OF THE DRAWINGS

Exemplary embodiments will be explained in more detail below based on the schematic drawings, wherein.

DETAILED DESCRIPTION

Figure 1:
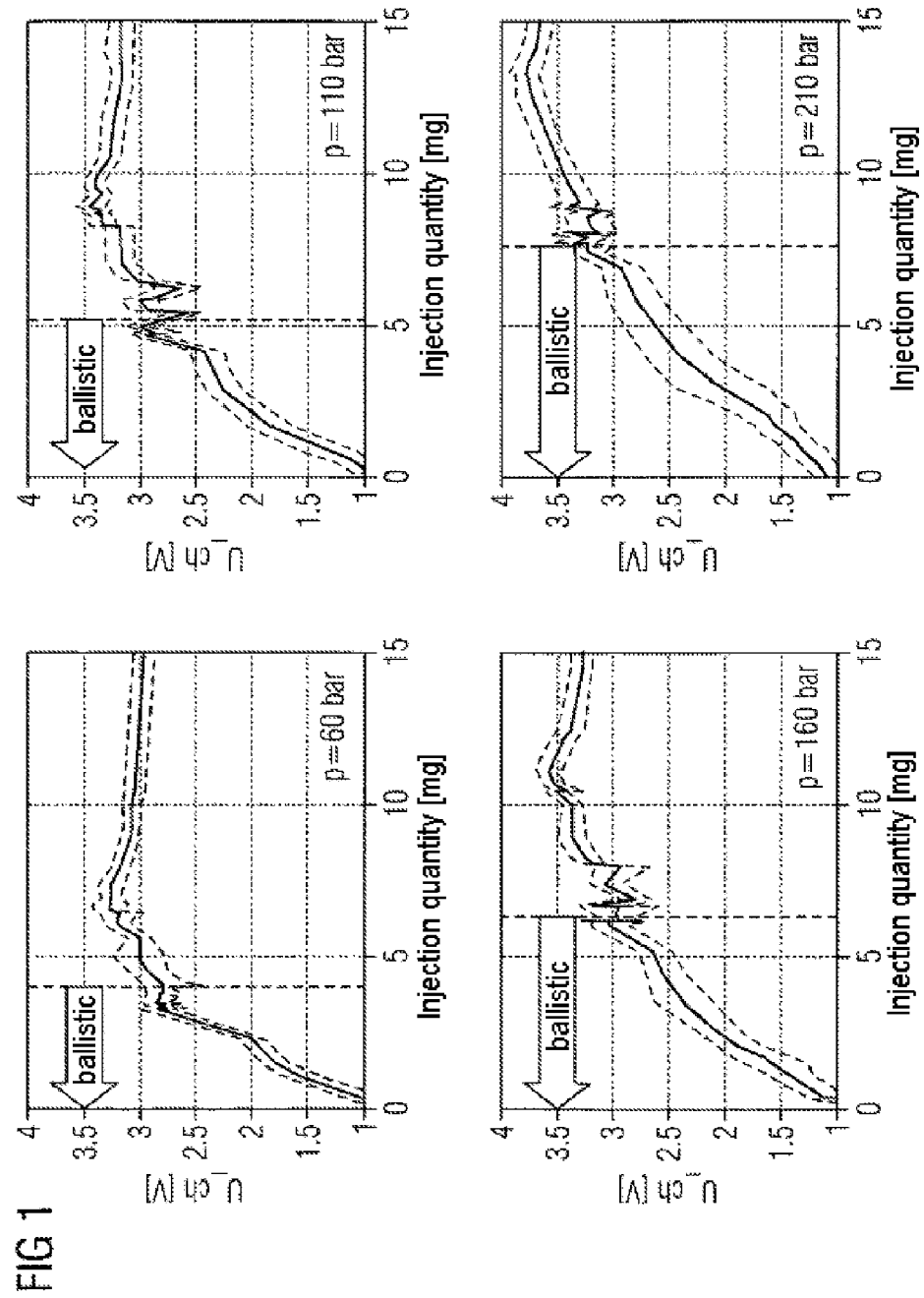
FIG. 1 shows, for different fuel pressures, the amplitude of the characteristic voltage measured at the coil of an injection valve at the time of closing of the injection valve as a function of the injection quantity.

The present disclosure is based on the object of specifying a method that can be implemented easily and a corresponding apparatus for accurately ascertaining the movement-time profile of an armature driven in the ballistic operating mode of an electromagnetic actuator.

Some embodiments provide a method for ascertaining the movement-time profile of an electromagnetically driven armature of an actuator having a coil is described. The described method comprises (a) applying a drive signal to the coil, which drive signal is dimensioned such that the armature (a1) experiences only partial deflection out of its initial position without reaching an end position defined by a stop, and (a2) after reaching a reversal position, reaches its initial position again, wherein, at least between the reversal position and the initial position, the deflection of the armature is described as a function of time at least approximately by a section of a parabola, (b) determining the time at which the armature reaches its initial position again, (c) determining the speed at which the armature reaches its initial position again, and (d) ascertaining the movement-time profile of the armature using a mathematical equation describing the parabola on the basis of the detected time and the detected speed.

The described method is based on the knowledge that, by detailed determination of the armature movement directly prior to it reaching its initial position again, the precise form of the parabola which describes the deflection, the stroke or the movement of the armature as a function of time can be determined. The information on the precise profile of this parabola can then be used to match the drive signals required for this for subsequent actuations of the electromagnetically driven actuator in such a way that a predetermined setpoint movement profile is at least approximately achieved in reality.

The described method may be suitable, e.g., for precise determination of the opening response over time of fuel injectors, which are operated in the so-called ballistic range. This means that, for the purposes of the injection of in each case only a particularly small quantity of fuel for each injection process, in each case only a very short drive pulse is applied to the coil of the actuator, with the result that the current flow through the coil has already ended when the armature still has to be perform a large proportion of its movement.

The described method may provide particularly precise information on the described movement profile of the armature when the current through the coil is zero at least when the armature is located on the path between the reversal position and the initial position. This means that, in this region, the armature is not subjected to any magnetic force caused by a current flow through the coil but, in a good approximation, only to the spring force of a spring which presses the armature in the direction of a stop of a housing of the actuator, wherein this stop defines the initial position of the armature.

In accordance with a further embodiment, the determination of the time comprises (a) detecting a time profile of a characteristic voltage induced in the deenergized coil, wherein the induced characteristic voltage is produced at least partially by a movement of the magnet armature relative to the coil, (b) evaluating the detected time profile of the characteristic voltage induced in the coil, wherein the evaluation comprises a comparison of the detected time profile of the characteristic voltage induced in the deenergized coil with a characteristic reference voltage profile stored in a control unit, and (c) ascertaining the time at which the armature reaches its initial position again, on the basis of the evaluated time profile.

This type of detection of the time at which the armature reaches its initial position again is based on the fact that a voltage signal which is caused by the movement of the armature, which has a magnetizable and/or magnetic material, by induction in the coil can be used to characterize the movement sequence of the armature and from this to ascertain the mentioned time.

In this case, the characteristic voltage signal caused by the movement owing to the remanant magnetic field of the armature by induction is typically at its greatest in the coil when the armature is located directly in front of its stop at its initial position. This is because in the deenergized state of the coil, the relative speed between the armature and the coil is at its maximum value directly before the stop of the moving armature.

This means that the voltage profile of the characteristic voltage induced in the deenergized coil is determined at least partially by the movement of the armature. By suitable evaluation of the time profile of the characteristic voltage induced in the coil, that component which is based on the relative movement between the armature and the coil can be ascertained at least to a good approximation. In this way, information on the movement profile is automatically also obtained, and this information permits conclusions to be drawn on the time of the maximum speed and therefore also on the time of the return of the armature to its initial position.

By virtue of the described comparison of the detected time profile of the characteristic voltage induced in the deenergized coil with a characteristic reference voltage profile, particularly precise information can be obtained on the actual movement of the armature.

The characteristic reference voltage profile can be selected, for example, such that it describes that component of the induced voltage which is caused by decaying eddy currents in the magnetic circuit. Thus, for example, the actual movement of the armature can be ascertained by simply forming the difference between the characteristic voltage induced in the coil and the characteristic reference voltage profile.

If the described actuator is used as an injection valve, the quantitative accuracy of the injection can be improved by correction of the armature closing time (equals time of return of the armature to its initial position). The measured variable for this regulation can be a characteristic bend in the curve profile of the induced voltage, which characteristic bend is derived from the voltage profile of the coil voltage during closing of the valve and is substantially caused by induction and change in inductance. In order to be able to calculate the essential characteristic for valve closing from the voltage signal profile, in accordance with the exemplary embodiment described here, a comparison with a characteristic reference signal or reference voltage profile is performed. The useful signal for determining the actual closing time can be obtained from the difference between the characteristic reference voltage profile and the characteristic profile of the induced voltage.

It is noted that the characteristic reference voltage profile can optionally also be matched to the present operating conditions of the actuator. In this case, the operating conditions can be principle be determined by all possible physical variables which can have an influence on the actual movement of the armature.

The operating conditions are determined, for example, by the ambient temperature and/or the operating temperature of the actuator. In addition, the present state of the actuator, which can change as a result of aging, for example, can also have an influence on the actual armature movement. In addition, a so-called manufacturing tolerance can result in the movement response of a determined individual actuator deviating at least slightly from a nominal response of a reference actuator.

In addition, not only can the mechanical system of the actuator be influenced by a temperature fluctuation, by aging and/or by manufacturing tolerance, for example, electrical properties of the coil such as its inductance and/or resistance can also be influenced by these operating conditions.

It is noted that the physical variables mentioned here which have an influence on the operating conditions of the valve are merely exemplary and do not represent an exhaustive list.

In accordance with a further exemplary embodiment of the invention, the determination of the speed comprises detecting a voltage level of the detected time profile of the characteristic voltage induced in the deenergized coil directly prior to the ascertained time at which the armature reaches its initial position again.

The described determination of the speed of the armature directly prior to its return to its initial position has the advantage that it can be based on the same measurement channel as the above-described determination of the time at which the armature reaches its initial position again. This means that both information items "time" and "speed" can be obtained from the detected and evaluated characteristic voltage signal. Thus, a current measurement can be dispensed with in an advantageous manner if required, for example.

In accordance with a further embodiment, the method also comprises a determination of a change in the speed of the armature directly before the armature reaches its initial position again. In this case, the determination of the movement-time profile of the armature is performed using a mathematical equation describing the parabola in addition on the basis of the detected change in speed.

By virtue of the described use of a third item of information on the movement response at or directly before the time at which the armature reaches its initial position again, the parameters for the parabola which describes the ballistic movement profile of the armature are determined particularly accurately.

In accordance with a further embodiment, the determination of the change in speed comprises detecting a change in the voltage level of the detected time profile of the characteristic voltage induced in the deenergized coil directly prior to the ascertained time at which the armature reaches its initial position again.

The described determination of the change in speed or the acceleration (more precisely the braking) of the armature directly prior to its return to its initial position has the advantage that it can likewise be based on the same measurement channel as the above-described determination of the time at which the armature reaches its initial position again and/or of the speed directly prior to the initial position being reached. This means that the information items "change in speed" and "time" and/or "speed" can be obtained from the detected and evaluated characteristic voltage signal. In this case, too, it is advantageously possible to dispense with a current measurement, for example, if required.

In accordance with a further embodiment, the actuator is an injection valve in particular for an internal combustion engine.

The described method may be suitable, e.g., for the precise determination of very small injection quantities for operation of an internal combustion engine which is ecologically sound and saves fuel. In this case, tolerances of the injection valve which are caused in particular by manufacturing tolerance can be detected in a reliable manner.

Said tolerances may be, for example, mechanical tolerances which are based, for example, on differences in the friction between the armature or valve needle and the valve housing or on differences in the spring strength of the restoring spring for the armature. Such tolerances can also be electrical tolerances, which are based, for example, on differences in the inductance and/or the resistance of the coil.

Other embodiments provide a method for regulated operation of an actuator is described, which actuator has a coil and an electromagnetically drivable armature which is mounted movably relative to the coil. The described method comprises (a) ascertaining the movement profile of the electromagnetically driven armature by means of a method of the above-described type for ascertaining the movement-time profile of an electromagnetically driven armature of an actuator having a coil, (b) applying a further drive signal to the coil, wherein the further drive signal is dependent on the ascertained movement-time profile of the armature in response to the drive signal in such a way that a further movement sequence as a result of the further drive signal at least approximately corresponds to a predeterminable setpoint movement profile.

The described regulation method for an actuator which is operated in the ballistic range is based on the knowledge that the above-described method for ascertaining the movement-time profile of the electromagnetically driven armature can advantageously be used to operate the actuator in such a way that the armature performs a predetermined movement profile as precisely as possible.

In the case of an injection valve, precise regulation for very low injection quantities of fuel can thus be realized in a simple and efficient manner, with the result that important requirements in respect of economic consumption of fuel and/or low levels of pollution can be met for modern motor vehicles having an internal combustion engine.

Other embodiments provide an apparatus for ascertaining the movement-time profile of an electromagnetically driven armature of an actuator having a coil is described. The described apparatus comprises (a) a drive unit for applying a drive signal to the coil, which drive signal is dimensioned such that the armature (a1) experiences only a partial deflection from its initial position without reaching an end position defined by a stop, and (a2) after reaching a reversal position, reaches its initial position again, wherein, at least between the reversal position and the initial position, the deflection of the armature is described as a function of time at least approximately by a section of a parabola, (b) a unit (b1) for determining the time at which the armature reaches its initial position again, and (b2) for determining the speed at which the armature reaches its initial position again, and (c) an evaluation unit for ascertaining the movement-time profile of the armature using a mathematical equation describing the parabola on the basis of the detected time and the detected speed.

The described apparatus is also based on the knowledge that, by virtue of detailed determination of the armature movement directly prior to it reaching its initial position again, the precise form of the parabola which describes the deflection, the stroke or the movement of the armature as a function of time can be determined. The information on the precise profile of this parabola can then be used to match, for successive actuations of the electromagnetically driven actuator, the drive signals required for this in such a way that a predetermined setpoint movement profile is at least approximately achieved in reality.

Other embodiments provide a computer program for ascertaining the movement-time profile of an electromagnetically driven armature of an actuator having a coil, in particular a direct injection valve for an internal combustion engine of a motor vehicle, is described. The computer program, when run by a processor, is designed to control the above-described method.

Within the meaning of this document, the designation of such a computer program has the same meaning as the term a program element, a computer program product and/or a computer-readable medium which contains instructions for controlling a computer system in order to coordinate the operation of a system or a method in a suitable manner in order to achieve the effects associated with the method according to the invention.

The computer program can be implemented as a computer-readable instruction code in any suitable programmable language such as, for example, JAVA, C++ etc. The computer program can be stored on a computer-readable storage medium (CD-Rom, DVD, Blue-ray disk, removable drive, volatile or nonvolatile memory, installed memory/processor etc.). The instruction code can program a computer or other programmable appliances such as, in particular, a control device for a motor of a motor vehicle in such a way that the desired functions are implemented. In addition, the computer program can be provided in a network such as the Internet, for example, from where it can be downloaded by a user as required.

Embodiments can be realized both by means of a computer program, i.e. software, and by means of one or more special electrical circuits, i.e. using hardware or any desired hybrid form, i.e. by means of software components and hardware components.

It is noted that various embodiments are described with reference to different inventive aspects. For example, some embodiments are described with method claims and other embodiments are described with apparatus claims. However, it will be immediately clear to a person skilled in the art when reading this application that, where not explicitly specified otherwise, any desired combination of disclosed features is also possible.

FIG. 1 shows, for four different fuel pressures, namely 60 bar, 110 bar, 160 bar and 210 bar, in each case one graph, in which the injection quantity per injection pulse is plotted on the x axis and the maximum value of the characteristic voltage occurring during the course of an entire injection cycle is plotted on the y axis. The continuous line shows in each case the measured maximum voltages, and the dashed lines each show an upper and lower error limit for the measured maximum voltages.

The ballistic operating range of the injection valve used, which is characterized by merely partial deflection of the valve needle, extends at p=60 bar from 0 mg to approximately 4 mg, at p=110 bar from 0 mg to approximately 5 mg, at p=160 bar from 0 mg to approximately 5.5 mg and at p=210 bar from 0 mg to approximately 8 mg. It can clearly be seen from the curves shown that, during ballistic operation of an injection valve, the maximum amplitude of the characteristic voltage is also dependent on the respective injection quantity, which is in turn dependent on the pressure of the fuel to be injected. This shows that the maximum amplitude of the profile of the characteristic voltage which is at a maximum owing to the maximum armature speed at or immediately before the closing time, is proportional to the armature speed at the closing time. This dependence is maintained until the full stop (end of the ballistic operating range) is reached.

The main concept of the method described in this document for ascertaining the movement-time profile of an electromagnetically driven armature of an actuator having a coil is to ascertain the parabolic movement-time profile in the ballistic operating range on the basis of (a) the time of closing of the injection valve and (b) information on the speed of the armature at the closing time. In accordance with the exemplary embodiment described here, in addition the change in the speed of the armature directly before the armature reaches its initial position again is also taken into consideration in order to determine particularly precisely the parabola or the parameters of the parabola.

A) Determination of the Closing Time:

The time of closing can be determined, for example, by the time at which the value of the characteristic voltage is at a maximum.

B) Determination of the Closing Speed:

In accordance with the exemplary embodiment described here, the speed of the closing operation is determined via the amplitude of the characteristic voltage at the closing time. In order to reduce errors in the speed determination, this can be implemented using a differential method by virtue of the change in voltage being evaluated at at least two different rates. As a result, the change in speed at the closing time can be detected very precisely.

C) Determination of the Change in Speed:

In accordance with the exemplary embodiment illustrated here, the change in speed directly prior to closing operation is determined from the change over time (corresponds to the time derivative) of the characteristic voltage immediately prior to the closing operation. The change over time in the characteristic voltage is at least in good approximation proportional to the acceleration or braking of the valve needle immediately prior to the closing time.

As described in detail below, these three values A), B) and C) clearly and completely determine the ballistic trajectory of the armature or the valve needle, fastened thereto, of the injection valve. Then, from the precise knowledge of the size and form of the parabola, the precise injection quantity for a previous injection pulse can be calculated. Precise knowledge of this previous injection quantity can then be used to adjust the electrical driving for subsequent injection pulses, with the result that a precisely defined quantity of fuel is injected.

The principle of the mathematical determination of the parabola or the parameters of the parabola which describes the ballistic trajectory of the armature or of the valve needle fastened thereto will be described below with reference to FIG. 2. The curve denoted by current I in this case describes, as a function of time t, a current pulse beginning at t=0, which current pulse is applied to the coil of an injection valve, with the result that a short-term magnetic field is produced which hits the armature as a result of magnetic interaction in such a way that the armature is deflected out of its initial position. As a result of the inductance of the coil, however, the coil current increases not in the form of a step but in the form of a ramp up to a current I_max determined, inter alia, by a boost voltage. In this case, the ramp is illustrated in good approximation by a straight line with a gradient which is substantially dependent on the inductance of the coil. In accordance with the exemplary embodiment illustrated here, once I_max has been reached, the current is first reduced down to a holding current I_hold before it is completely switched off at a slightly later time, which is no longer relevant for further considerations. From this point on, the coil is then located in a deenergized state.

In particular as a result of the mechanical inertia of the armature or of the valve needle fastened thereto, the armature deflection does not begin directly with the current pulse. The beginning of the armature deflection instead takes place with a certain time delay at a time t1. Since the coil is already in the deenergized state at the beginning of the armature deflection, the deflection curve which is characterized by "Deflection z" in FIG. 2, is described with a very good approximation by a parabola. The maximum value z_max of the parabola is in this case determined by the force of the deflection impact and by the spring constant of a spring, which presses the armature into its initial position.

Figure 2:
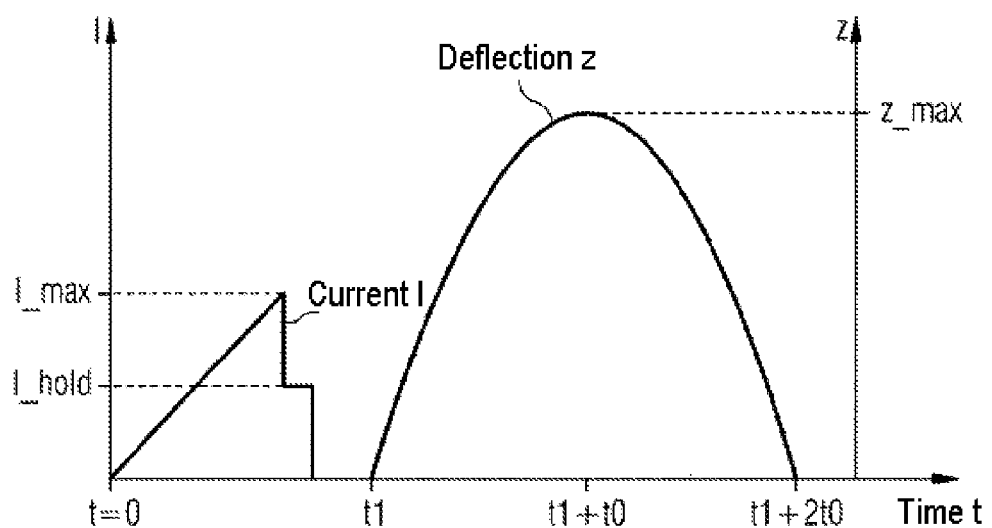
FIG. 2 shows, for an injection valve, an exemplary drive current pulse which, after a certain time delay, initiates a ballistic, parabolic partial deflection of the valve needle of the injection valve.

The parabola illustrated in FIG. 2 is described for the time range $t1 \le t \le t1+2t0$ by the following equation:

$$z = z\_max - z\_max\left(\frac{t}{t0} - 1 - \frac{t1}{t0}\right)2 \tag{1}$$

As can be seen from FIG. 2, ts==t1+2t0 is the closing time of the injection valve.

The first derivation of equation (1) is:

$$\frac{dz}{dt} = -\frac{2z\_max}{t0}\left(\frac{t}{t0} - 1 - \frac{t1}{t0}\right) \tag{2}$$

For the closing time t=ts=t1+2t0, the following results for the speed of the armature movement:

$$\frac{dz}{dt} = -\frac{2z\_max}{t0} \tag{3}$$

As has already been described above, the speed of the armature movement determines the characteristic voltage U which can be measured in a simple manner. Thus:

$$\frac{dz}{dt} \sim U \tag{4}$$

The second derivation of equation (1) is:

$$\frac{d^2 z}{dt^2} = -\frac{2z\_max}{t0^2} \quad (5)$$

In addition:

$$\frac{d^2 z}{dt^2} \sim \frac{dU}{dt} \quad (6)$$

Since the change over time in the characteristic voltage U can also be measured in a simple manner directly prior to the closing time is known in the meantime, all three parameters z_max, t0 and t1 of the parabola can be determined in a simple manner using equations (3), (4) and (6).

The method described in this document enables in a simple manner the complete determination of the armature deflection curve in the ballistic operating range of an injection valve. As a result, the trajectories of the valve needle and the trigger delays and/or stroke errors associated therewith can be compensated for by means of suitable regulation for future ballistic deflections. Since the correction values required for corresponding regulation can be determined at the respective operating point during ballistic operation, the transfer error from full stroke to partial stroke, as needed to be taken into consideration in the previous methods, has additionally been reduced to the value "0" for a high level of accuracy of this information.

This results in both increases in accuracy in the determination of the precise stroke profile z(t) and in simplification of the hardware circuitry by virtue of dispensing with an additional measurement channel for other measured variables which are not required here, apart from the detection of the characteristic voltage, in comparison with known regulation methods.

It is noted that the method specified and described here in more detail for the voltage measurement can be extended by both current measurement and opening and closing detection. In addition, the intended use is not restricted to fuel injectors, but can also be used for all electromagnetically driven devices which are deflected in the ballistic range.

What is claimed is:

1. A method for correcting the operation of an electromagnetically driven armature of an actuator having a coil, the method comprising:
   applying a drive signal to the coil, the drive signal being dimensioned such that the armature:
      experiences only a partial deflection from its initial position without reaching an end position defined by a stop, and
      after reaching a reversal position, again reaches its initial position, wherein, at least between the reversal position and the initial position, the deflection of the armature as a function of time is described at least approximately by a section of a parabola,
   determining a time at which the armature reaches its initial position again,
   determining a speed at which the armature reaches its initial position again,
   determining a reference movement-time profile of the armature using a mathematical equation described in the parabola based on the detected time and the detected speed, and
   adjusting a further drive signal to the coil based on the reference movement-time profile of the armature and a predetermined setpoint movement profile to account for tolerances in the actuator or the coil.

2. The method of claim 1, wherein determining the time at which the armature reaches its initial position again comprises:
   detecting a time profile of a characteristic voltage induced in the deenergized coil, wherein the induced characteristic voltage is produced at least partially by a movement of the magnet armature relative to the coil,
   evaluating the detected time profile of the characteristic voltage induced in the coil, wherein the evaluation comprises a comparison of the detected time profile of the characteristic voltage induced in the deenergized coil with a characteristic reference voltage profile stored in a control unit, and
   determining the time at which the armature reaches its initial position again, based on the evaluated time profile.

3. The method of claim 1, wherein determining the speed at which the armature reaches its initial position again comprises detecting a voltage level of the detected time profile of the characteristic voltage induced in the deenergized coil directly prior to the determined time at which the armature reaches its initial position again.

4. The method of claim 1, further comprising determining a change in the speed of the armature directly before the armature reaches its initial position again,
   wherein the determination of the movement-time profile of the armature is performed using a mathematical equation describing the parabola further based on the determined change in speed.

5. The method of claim 1, wherein the determination of the change in speed comprises detecting a change in the voltage level of the detected time profile of the characteristic voltage induced in the deenergized coil directly prior to the determined time at which the armature reaches its initial position again.

6. The method of claim 1, wherein the actuator comprises an injection valve for an internal combustion engine.

7. A method for the regulated operation of a fuel injector including an actuator having a coil and an electromagnetically drivable armature movably mounted relative to the coil, the method comprising:
   determining a movement profile of the electromagnetically driven armature by:
      applying a drive signal to the coil, the drive signal being dimensioned such that the armature:
         experiences only a partial deflection from its initial position without reaching an end position defined by a stop, and
         after reaching a reversal position, again reaches its initial position, wherein, at least between the reversal position and the initial position, the deflection of the armature as a function of time is described at least approximately by a section of a parabola,
      determining a time at which the armature reaches its initial position again,
      determining a speed at which the armature reaches its initial position again, and
      determining the movement-time profile of the armature using a mathematical equation described in the parabola based on the detected time and the detected speed, and
   adjusting a profile of a further drive signal to the coil, wherein the further drive signal is dependent on the determined movement-time profile of the armature in response to the drive signal in such a way that a further movement sequence as a result of the further drive signal at least approximately corresponds to a predetermined setpoint movement profile for a desired injection quantity of fuel delivered by the fuel injector and accounts for any tolerances in the actuator or the coil.

8. An apparatus for determining a movement-time profile of an electromagnetically driven armature of an actuator having a coil, the apparatus comprising:
   a drive unit configured to apply a drive signal to the coil, the drive signal being dimensioned such that the armature:
      experiences only a partial deflection from its initial position without reaching an end position defined by a stop, and
      after reaching a reversal position, reaches its initial position again, wherein, at least between the reversal position and the initial position, the deflection of the armature as a function of time is described at least approximately by a section of a parabola;
   a processor configured to:
      determine a time at which the armature reaches its initial position again, and
      determine a speed at which the armature reaches its initial position again, and
   an evaluation unit configured to determine the movement-time profile of the armature using a mathematical equation describing the parabola based on the detected time and the detected speed.

9. A computer program for controlling the movement of an electromagnetically driven armature of an actuator having a coil, wherein the computer program is stored in non-transitory computer-readable media and executable by a processor to perform the method of claim 1.

10. The method of claim 7, wherein determining the time at which the armature reaches its initial position again comprises:
   detecting a time profile of a characteristic voltage induced in the deenergized coil, wherein the induced characteristic voltage is produced at least partially by a movement of the magnet armature relative to the coil,
   evaluating the detected time profile of the characteristic voltage induced in the coil, wherein the evaluation comprises a comparison of the detected time profile of the characteristic voltage induced in the deenergized coil with a characteristic reference voltage profile stored in a control unit, and
   determining the time at which the armature reaches its initial position again, based on the evaluated time profile.

11. The method of claim 7, wherein determining the speed at which the armature reaches its initial position again comprises detecting a voltage level of the detected time profile of the characteristic voltage induced in the deenergized coil directly prior to the determined time at which the armature reaches its initial position again.

12. The method of claim 7, further comprising determining a change in the speed of the armature directly before the armature reaches its initial position again,
   wherein the determination of the movement-time profile of the armature is performed using a mathematical equation describing the parabola further based on the determined change in speed.

13. The method of claim 7, wherein the determination of the change in speed comprises detecting a change in the voltage level of the detected time profile of the characteristic voltage induced in the deenergized coil directly prior to the determined time at which the armature reaches its initial position again.

\* \* \* \* \*